(12) United States Patent
Vahala et al.

(10) Patent No.: US 6,317,252 B1
(45) Date of Patent: Nov. 13, 2001

(54) DYNAMIC CHANNEL COPYING DEVICE FOR USE IN FIBER OPTICS SYSTEM USING A NONLINEAR OPTICAL MEDIA

(75) Inventors: Kerry J. Vahala, San Gabriel, CA (US); Roberto Paiella, Milan (IT); Guido Hunziker, Altadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/226,805

(22) Filed: Jan. 6, 1999

Related U.S. Application Data
(60) Provisional application No. 60/070,547, filed on Jan. 6, 1998.

(51) Int. Cl.[7] .................................................. G02F 1/39
(52) U.S. Cl. ............................................. 359/326; 359/330
(58) Field of Search ...................................... 359/326–332

(56) References Cited

U.S. PATENT DOCUMENTS

| | | | |
|---|---|---|---|
| 5,195,104 | * 3/1993 | Geiger et al. | 359/330 X |
| 5,233,462 | * 8/1993 | Wong | 359/330 |
| 5,243,610 | * 9/1993 | Murata | 359/328 X |
| 5,619,368 | * 4/1997 | Swanson | 359/326 |
| 5,943,161 | * 8/1999 | Shinozaki et al. | 359/330 |
| 5,946,129 | * 8/1999 | Xu et al. | 359/332 |

* cited by examiner

*Primary Examiner*—John D. Lee
(74) *Attorney, Agent, or Firm*—Fish & Richardson P.C.

(57) ABSTRACT

A channel-obtaining device takes the desired channel and uses a resonant semiconductor device to mix the channel to a different frequency. The dropped channel is sufficiently removed from the other channels in frequency that it can be effectively separated.

16 Claims, 3 Drawing Sheets

DYNAMIC CHANNEL COPYING DEVICE FOR USE IN FIBER OPTICS SYSTEM USING A NONLINEAR OPTICAL MEDIA

CROSS REFERENCE TO RELATED APPLICATIONS

This application claims the benefit of the U.S. Provisional Application Nos. 60/070,547, filed on Jan. 6, 1998, which is incorporated herein by reference.

STATEMENT AS TO FEDERALLY SPONSORED RESEARCH

This work was supported by a grant from ARPA (Contract # DAAL 01-94-K-03430) and National Science Foundation (Grant # ECS-9412862). The government may have certain rights in this invention.

BACKGROUND

The present disclosure describes a system for copying an optical channel in an optical communications system. More specifically, the present system describes a special kind of four-wave mixing element which enables dynamic copying of single or multiple channels.

Fiber optic cable has the capability of carrying an enormous amount of information. Demand for bandwidth in long distance communication lines is growing rapidly because of applications like the Internet.

To accommodate this bandwidth growth, commercial fiber optic systems now employ wavelength division multiplexing "WDM" in which information is carried on many optical wavelengths spanning a wide optical bandwidth. Each wavelength is called a channel and can carry substantial amounts of information.

It may be desirable at some times to copy the information in one channel or a subset of channels.

For example, in applications such as next-generation-Internet, a fiber optical cable will carry multiple wavelengths and use packet switching techniques. Reading header information on a packet, for example, could require a device that can copy the channel which contains the packet. Once copied to a specific wavelength in the optical spectrum, the information can be conveniently filtered using a fixed wavelength filter and then read (i.e., detected). Clearly, it is important for the copying process to be non destructive.

SUMMARY OF THE INVENTION

The present system teaches a technique of modifying certain channel information in a way that allows the modified channel information to be separated from the other information.

The preferred mode carries this out by using a non-linear medium to mix the desired channel with a pump wave that shifts the information in the desired channel to a different frequency that corresponds to a resonant frequency of a cavity or resonator. The preferred non linear medium is a semiconductor four wave optical mixer that also provides optical gain for the resonator. The system also includes an optical Bragg filter, to create resonant enhancement of only a specified frequency sifted wave.

BRIEF DESCRIPTION OF THE DRAWINGS

These and other aspects of the invention will now be described in detail with reference to the accompanying drawings, wherein.

DESCRIPTION OF THE PREFERRED EMBODIMENTS

Figure 1:
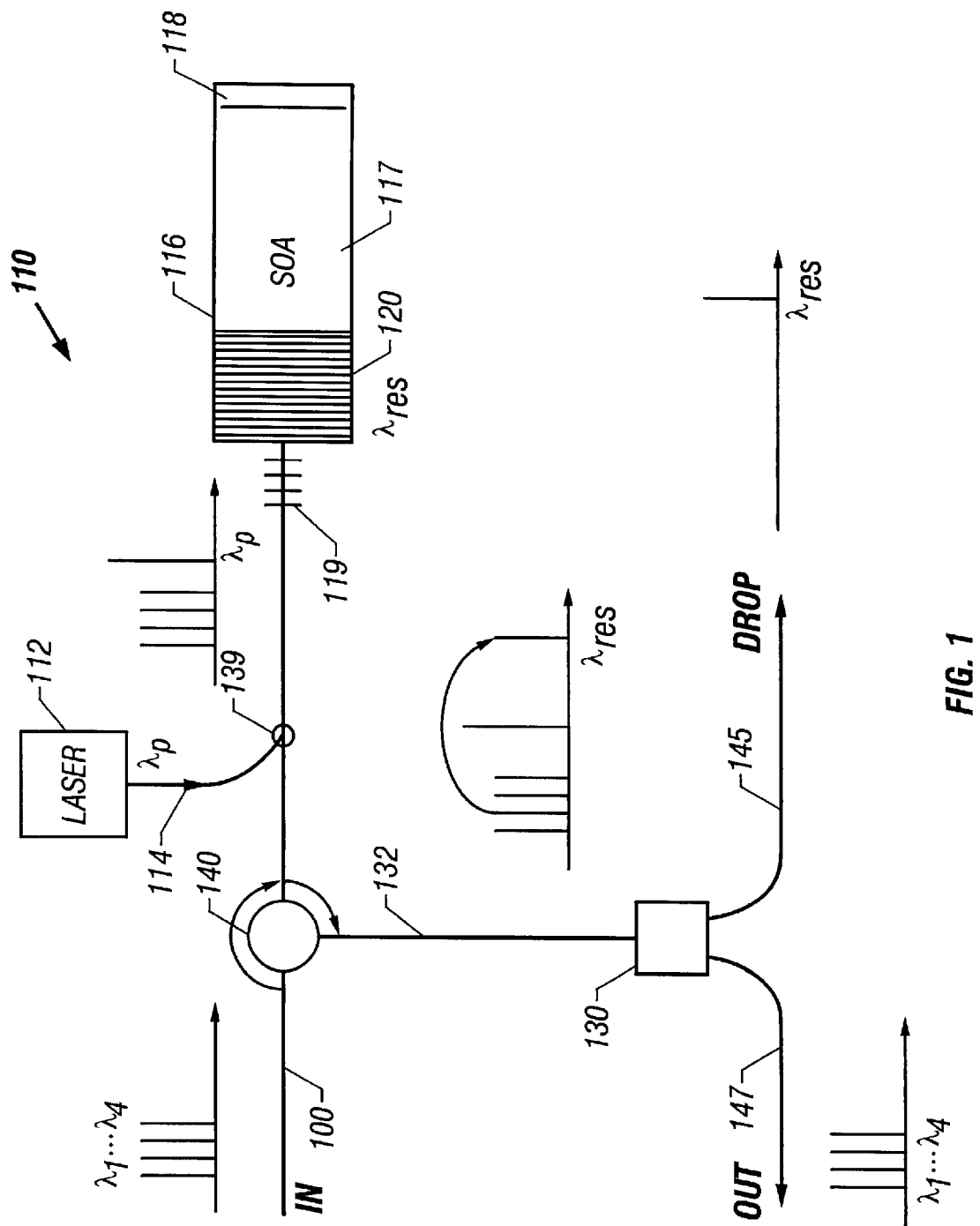
FIG. 1 shows a block diagram of the overall system.

A block diagram of the overall embodiment is shown in FIG. 1. Input fiber 100 represents the input to the system. The input includes several optical channels propagating in the same fiber. These channels are shown to include $\lambda_1 \ldots \lambda_4$ for simplicity. However, the system may include hundreds of channels. These channels are coupled into an optical mixing device, preferably a four-wave mixing device 110 of a special type which is equipped for selective injection-locked enhancement of a resonant converted signal that is generated in the device. The resonance renders the four-wave injection device 110 wavelength selective, e.g., so that it enables modifying a specific channel.

The system generates a wavelength-converted replica of less than all of the channels. The preferred mode wavelength converts only a single channel, which we here define as $\lambda_2$.

A preferred mode uses a fiber-Bragg-grating coupled laser diode. The grating can alternatively be a grating formed on a chip, e.g. a semiconductor substrate. The optical gain medium in this case functions as both the nonlinear mixing medium and the amplifying mechanism to enable laser action. The gain medium is a semiconductor in the preferred embodiment. A pump laser 112 produces a pumping wavelength $\lambda_p$ 114. The pump tunes the four-wave mixer, to produce a four-wave mixing replica $\lambda_2^* = \lambda_{res} = 2\lambda_p - \lambda_2$. This value is selected to be resonant with a mode of the laser cavity formed by the Bragg grating and the back facet of the semiconductor chip—the resonance wavelength of the semiconductor optical amplifier 116 within the four-wave mixer.

An alternative uses an integrated tunable grating in which the resonance wavelength $\lambda_{res}$ itself is tuned to pick up the desired converted channel, while the pump wavelength $\lambda_p$ is fixed.

While the present system describes the special case of a single resonance at $\lambda_2$, it should be noted that several resonances could be used simultaneously in order to remove a plurality of input channels.

A frequency selective tap 130 is used at the output of the converter 110 to isolate the converted signals from the original channels. FIG. 1 shows the converted signal wavelength $\lambda_2^* = \lambda_{res}$ being fixed and tuned according to $\lambda_p$. Hence, the frequency-selective tap 130 in this embodiment can be implemented using another fiber-Bragg-grating having a narrow reflection wavelength centered at $\lambda_{res}$.

In the alternative embodiment in which the pump wavelength $\lambda_p$ is fixed and tuned according to $\lambda_{res}$, the operation could be realized with a properly-designed wavelength division multiplexer that routes all wavelengths shorter than $\lambda_p$ to one output port and all wavelengths longer than $\lambda_p$ to the other.

An optical recirculator 140 couples the optical waves as shown such that the input wave 100 is coupled to the SOA 116, and the reflection from the SOA is coupled to the copy line 132 which is connected to the frequency selective tap 130.

The result is that one out of the several wavelength-division-multiplexed channels has been dynamically selected. This one channel is converted to a new wavelength $\lambda_{res}$. This new wavelength is far enough from the other channels to allow the one channel to be filtered. The new wavelength can be separated from the other wavelengths. The original data stream is left unaffected, i.e. the copying process in non destructive). Hence, the removed channel 145 is centered on $\lambda_{res}$ as converted from $\lambda_2$. The output channel 147 remains unaffected, and is shown including $\lambda_1 \ldots _4$.

This same system can also be used to drop channels by separating only the desired channels, down converting those desired channels, and using those new channels as the new signal.

Such a device would have many applications, including use as a dynamic network interface. In this case, channels from a conventional C-band WDM network are dynamically converted to long wave length L-band WDM network. By tuning the pump wavelength $\lambda_p$ and the resonant wavelength $\lambda_{res}$, the device can dynamically select the desired channels and also the converted wavelength.

The device 116 is preferably formed from a semiconductor optical amplifier 116 that includes a cavity operating as a semiconductor laser. One end of the laser cavity includes a high-reflection coating 118. The other end 120 is anti-reflection coated. The other end is also coupled via a narrow band pigtailed fiber-Bragg-grating 119.

The input signal 100 is assumed to be carrying digital information. Both this input signal 100 and the four-wave mixing pump wave 114 are injected into the laser-active region 117 within the semiconductor optical amplifier 116. The pump wave 114 can be coupled using an optical circulator 139 which can be separate from or the same as the optical circulator 140.

The pump wave is preferably at $\omega_p$ and $\omega_q$ respectively. These waves are selected to lie outside of the reflection band of the Bragg-grating 119 and hence are passed by the Bragg-grating into the semiconductor optical amplifier. For these waves, the semiconductor laser simply acts as a folded path semiconductor optical amplifier mixer.

The pump and signal frequencies are preferably also chosen so that the corresponding four-wave mixing signal frequency $\omega_s=2\omega_p-\omega_q$ lies within the Bragg reflection band. This frequency $\omega_s$ is also closely tuned to a resonance frequency of the laser cavity 117.

Then, when the laser is biased near threshold, the FWM signal can injection seed the lasing mode and is correspondingly enhanced by the lasing action. While this is similar to injection locking, here the master laser beam is not directly injected. Rather, the master is generated inside the slave laser medium 117 by a non-linear interaction between the input waves.

This enhancement can be modeled by solving the coupled mode wave equations for four-wave mixing subject to boundary conditions. This shows that the conversion efficiency H, the ratio between the in-fiber converted signal output power to the input signal power coupled to the circulator is $$\frac{\eta}{\eta\mid R_{BG} \to 0} = \frac{1 - R_{BG}\omega_s}{\left|1 - C\sqrt{R_{BG}(\omega_s)}\,G(\omega_s)e^{i\Delta\Phi(\omega_s)}\right|^2} \quad (1)$$

where $R_{BG}$ is the power reflectivity of the Bragg mirror, C is the fraction of light that is coupled from the fiber into the SOA (and vice versa), and G and $\Delta\Phi$ are the net gain and phase shift respectively experienced by the field amplitude in a round trip in the SOA. The reflectivity of the high-reflection coated facet is taken to be unity. Furthermore, $\eta\mid R_{BG\to0}$ denotes the FWM conversion efficiency of the same device under identical operating conditions but without the FBG, so that Eq. (1) is a measure of the performance enhancement associated with the optical feedback. In the case of standard laser operation, this same factor gives the ratio of the output power of the laser to the amount of spontaneous-emission noise power emitted into the lasing mode. At threshold, where the gain nearly equals the losses, and for $\omega_s$ close to a resonance frequency of the laser cavity, it becomes very large, resulting, in the present case, in a strong resonance enhancement of the FWM conversion efficiency (as well as signal-to-noise ratio). This mechanism is different from injection locking which has recently been considered for several all-optical switching applications. Here, the "master" laser beam is not directly injected, but rather is generated inside the "slave" laser cavity by the FWM interaction between the input waves.

Figure 2:
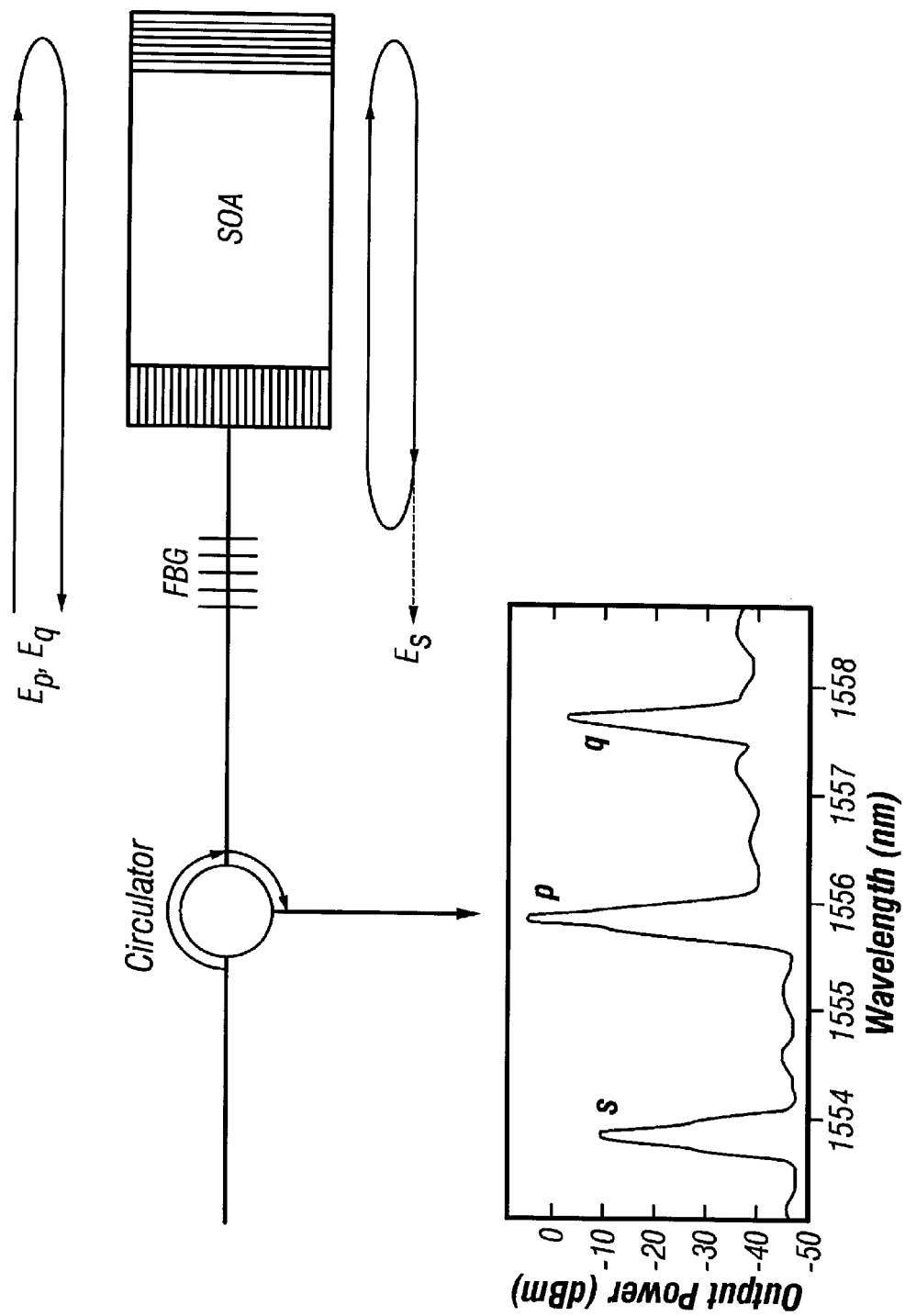
FIG. 2 shows an optical spectrum of a preferred optical resonator system.

FIG. 2 shows a typical optical spectrum measured at the output of the device at resonance. The wavelength downshift is 4 nm and a total optical power of about 4 dBm is input into the SOA. This data shows that conversion efficiency and signal-to-noise ratio are greatly enhanced.

In fact, taking into account the amplification experienced by the input signal in the folded-path SOA, the conversion efficiency is close to unity in this case (near threshold the fiber-to-fiber gain is approximately equal to $1/R_{BG}\approx6$ dB). The measured variation of the conversion efficiency with the FWM signal frequency is illustrated in FIG. 2, where several resonances, associated with several modes of the external cavity, are clearly seen. The spectral width of these resonances (the locking range) is found to be quite small, less than 2 Ghz for all the peaks in the figure.

The bandwidth of the injection-locking resonances, and hence the maximum bit rate, can be increased by modification of the laser cavity. In order to see how this can be achieved, it is convenient to recast the conversion efficiency enhancement of Eq. (1) in terms of directly measurable parameters. For $\omega_s$ close to any resonance frequency (as will be assumed from here on), Eq. (1) is well approximated by a Fabry-Perot transmission peak with FWHM $\delta v_L$ (a measure of the locking range) and maximum value $E_{max}$ (the peak enhancement in the FWM conversion efficiency) given by $$\delta_{vL} \approx \frac{\Delta v}{\pi}\frac{1 - e^{\Gamma A\Delta NL}}{e^{\Gamma A\Delta NL/2}}, \quad (2)$$

$$E_{max} \approx \frac{1 - R_{BG}(v_{th})}{(1 - e^{\Gamma A\Delta NL})^2}$$

where A is the material differential gain, r is the confinement factor, L is the SOA length, $v_{th}$ is the resonance frequency under consideration at threshold, and $\Delta v = c/(l_{BG}(v_{th})+2L)$ is the cold-cavity free spectral range near $v_{th}$ ($l_{BG}$ denotes the effective optical path length from the antireflection coated facet of the SOA into the Bragg mirror and back to the same facet). Finally, $\Delta N$ (<0 under injection-locking conditions) is the deviation of the steady-state carrier density from its value at threshold, given by $$\Delta N = \frac{(I - I_{th})/(qV_a) - g_{th}\overline{P}/(\Gamma\hbar\omega S_m)}{1/T_{sp} + A\overline{P}/(\hbar\omega S_m)} \quad (3)$$

where I is the laser bias current, $V_a$ is the volume of the active region, $S_m$ is the modal cross-sectional area, $T_{sp}$ is the spontaneous and nonradiative recombination lifetime, $g_{th}$ is the modal gain coefficient at threshold ($g_{th}=\gamma+1/L \log(1/(C$ sqrt ($R_{BG}$)), $\gamma$ being the SOA scattering loss coefficient, and $\overline{P}$ is the average optical power in the SOA.

Under the present experimental conditions, the contribution to $\overline{P}$ from the mixing signal power can be neglected, since it is considerably smaller than the pump contribution. This has the important consequence that the entire locking range predicted by the present steady-state analysis is stable against small carrier density fluctuations otherwise, in the context of standard injection-locking, if the laser gain is saturated by the injection-locked beam itself, a fraction of the steady-state locking range will actually become unstable for nonzero line width enhancement factor. The average power $\overline{P}$ can be easily related to the in-fiber input power Pn using the FWM coupled-mode equations; the result is $$\overline{P} = \frac{P^{in}}{CR_{BG}} \frac{e^{2\Gamma A\Delta NL}C^2 R_{BG}}{(g_{th} + \Gamma A\Delta N - \gamma)L} \quad (4)$$

(here $R_B$ is evaluated at the frequency of the lasing mode in the absence of externally injected waves). $\Delta N$ can then be expressed as a (implicit) function of $P^{in}$ by eliminating $\overline{P}$ between Eqs. (3) and (4).

Figure 3:
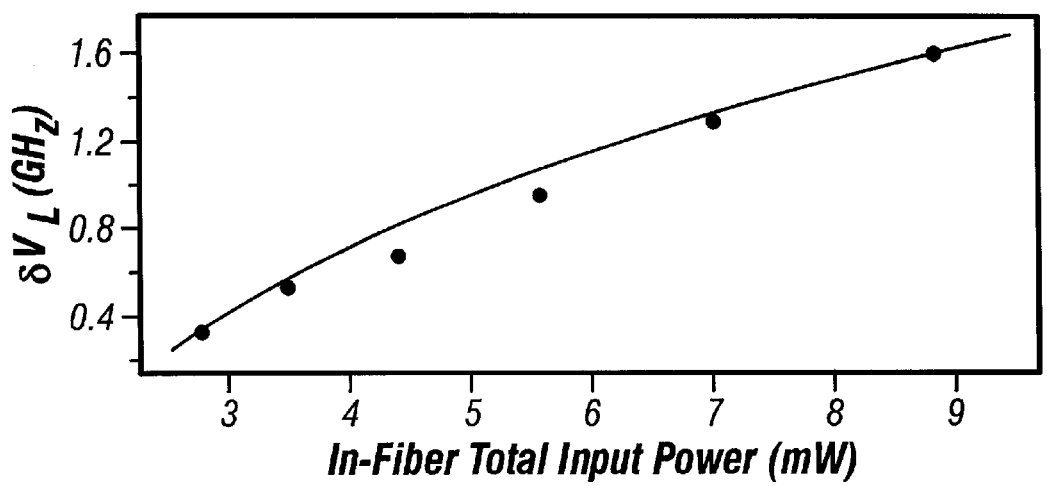
FIG. 3 shows relationship between pump power and response.
Figure 3:
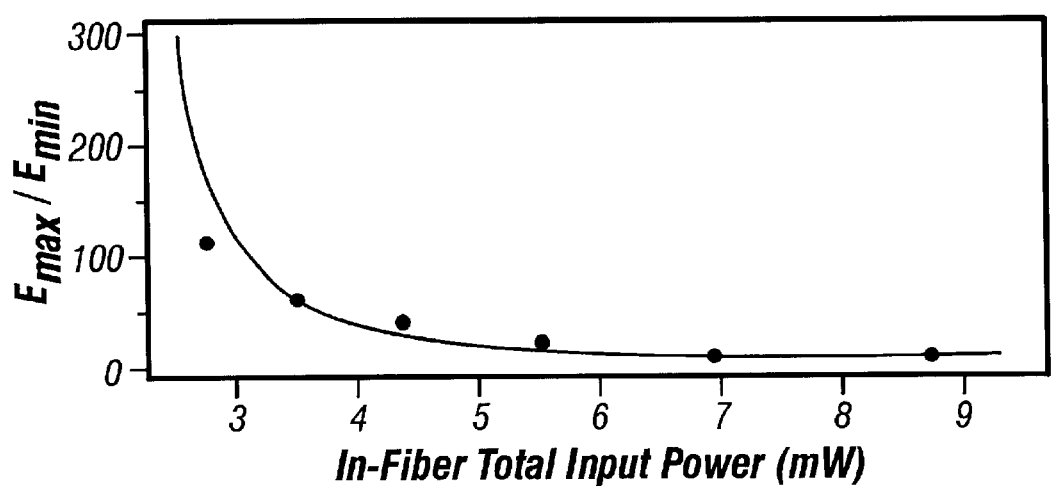

A first observation that follows from Eq. (2) is that the locking range increases with increasing $\Gamma A|\Delta N|L$; the FWM signal enhancement, however, correspondingly undergoes a (larger) decrease. To illustrate this point, we plot in FIG. 3 $\delta_{VL}$ and $E_{max}/E_{min}$ (the peak-to-valley ratio of the resonance, given by $((1+e^{\Gamma A\Delta NL})$ versus the input power ($|\Delta N|$ increases with increasing $P^{in}$ as confirmed by Eqs. (3) and (4)). The circles in the figure are experimental values (corresponding to the resonance peak centered at the lasing frequency); the continuous lines are theoretical fits based on the expressions above, with all the relevant parameters as listed in the caption. The quantity $\Gamma A|\Delta N|L$ should then be optimized to achieve the largest possible locking range for which the FWM conversion efficiency remains larger than a given threshold (e.g., large enough to support error-free wavelength conversion in a given link). As clearly indicated by FIG. 3, this can be simply accomplished by varying the input pump power (and any change in any other laser parameter involved in the expression for $\Gamma A|\Delta N|L$ will cause a change in this optimum input pump power, but will not otherwise affect the maximum bit rate at which the wavelength converter can operate).

Instead, the maximum bit rate can be increased by increasing the free-spectral range $\Delta_v$ (in particular by minimizing the optical path length in the fiber $l_{BG}$, which, in the present device, accounts for most of the measured 7 Ghz free spectral range), since the locking range increases linearly with it, while the conversion efficiency is not affected. In practice this means, for instance, writing the grating as close to the lensed fiber tip as possible, and reducing its length (the corresponding decrease in reflectivity, while increasing the laser threshold, is if anything advantageous for this application since it increases $E_{max}$. In particular, based on the present experimental results, if $\Delta_v$ could be increased by a factor of three, the device would become well suited to operation at 2.5 Gbit/sec, the prevalent bit rate per channel currently used in telecom systems. On the other hand, for operation at 10 Gbit/sec and faster, more dramatic design innovations are likely required, such as, for instance, using an on-chip DBR to provide the optical feedback.

Although only a few embodiments have been described in detail above, other embodiments are contemplated by the inventor and are intended to be encompassed within the following claims. In addition, other modifications are contemplated and are also intended to be covered.

What is claimed is:

1. A semiconductor optical system for copying a desired optical channel among a plurality of optical channels, comprising:
   a non-linear optical mixing medium receiving said optical channel and operable to mix said optical channel with a pump wave at a pump frequency to produce a signal at a converted frequency associated with a channel frequency of said optical channel and said pump frequency;
   a laser cavity configured to enclose said mixing medium and have a plurality of resonant frequencies, said laser cavity having a first reflector on one side of said mixing medium that reflects optical waves at said channel frequency, said converted frequency, and said pump frequency, and a second reflector on another side of said mixing medium to receive said optical channel, wherein said second reflector has a high reflectivity at said converted frequency and transmits light at any wavelength different from said converted frequency;
   a pump laser, producing said pump wave different than a desired optical channel to be copied, and injecting said pump laser into said mixing medium within said laser cavity, said pump laser being selected such that a mixing action between said pump wave and said desired channel produces a frequency shifted copy of said optical channel at said converted frequency at or near a resonant frequency of said laser cavity, wherein said laser cavity is operable to amplify optical energy at said converted frequency and transmit said optical channel and a portion of amplified optical energy at said converted frequency as a copied signal through said second reflector; and
   a frequency selective device coupled to receive said optical channel and said copied signal from said second reflector and operable to separate said optical channel from said copied signal at said converted frequency.

2. A system as in claim 1 wherein said second reflector is tunable to change its transmissive frequency to select said channel frequency of said optical channel to be copied into said converted frequency.

3. A system as in claim 1, wherein said second reflector includes a fiber Bragg grating formed in a fiber.

4. A system as in claim 1, wherein said pump laser is tunable to produce different pump frequencies which are outside of a reflection band of said second reflector and to select different optical channels to be copied into said converted frequency.

5. A system as in claim 4 wherein said mixing medium includes a semiconductor optical amplifier.

6. A system as in claim 1, wherein the pump frequency is selected such that a converted signal frequency from the four-wave mixer is equal to $2\omega p-\omega q$ where $\omega p$ is said pump frequency and $\omega q$ is said channel frequency to be copied, respectively, both of which lie outside a reflection band of said second reflector.

7. A system as in claim 1, wherein said second reflector is a Bragg grating on a semiconductor substrate.

8. A system as in claim 7, wherein said Bragg grating is a DBR device.

9. A method, comprising:
   injecting at least a selected channel at a selected channel wavelength from a plurality of WDM channels at different channel wavelengths into a nonlinear optical medium;
   injecting a pump wave at a selected pump wavelength different from said selected channel wavelength into said nonlinear optical medium to mix with said selected channel, via a nonlinear wave mixing process, to produce a wave-mixing signal at a converted wavelength different from said channel wavelengths and said pump wavelength, wherein said wave-mixing signal has a copy of information in said selected channel;

amplifying said wave-mixing signal by using an optical gain produced by said nonlinear optical medium;

exporting said WDM channels and said wave-mixing signal from said nonlinear optical medium; and separating said wave-mixing signal, which is a copy of said selected channel, from said WDM channels, which retain information prior to being injected into said nonlinear optical medium.

10. The method as in claim 9, wherein said nonlinear optical medium includes an optical semiconductor amplifier.

11. The method as in claim 9, further comprising using a Bragg reflector to reflect optical energy at said converted wavelength back to said nonlinear optical medium and to transmit optical energy at wavelengths different from said converted wavelength.

12. The method as in claim 11, further comprising using said Bragg reflector for both receiving said WDM channels and said pump wave into said nonlinear optical medium, and exporting said WDM channels and said wave-mixing signal out of said nonlinear optical medium.

13. The method as in claim 9, further comprising tuning said selected pump wavelength of said pump wave to select a channel from said WDM channels to be copied through said nonlinear wave mixing.

14. The method as in claim 9, further comprising using a tunable optical filter to selectively reflect optical energy at a selected channel wavelength back to said nonlinear optical medium to select a channel from said WDM channels to be copied through said nonlinear wave mixing, without tuning said pump wavelength.

15. The method as in claim 9, further comprising both tuning said selected pump wavelength of said pump wave and using a tunable optical filter to selectively reflect optical energy at a selected channel wavelength back to said nonlinear optical medium, to select a channel from said WDM channels to be copied through said nonlinear wave mixing.

16. The method as in claim 9, wherein said WDM channels are in the C-band while the wave-mixing signal is in the L-band.

* * * * *